United States Patent
Yamaguchi et al.

(10) Patent No.: US 9,570,599 B2
(45) Date of Patent: Feb. 14, 2017

(54) TRANSISTOR HAVING NITRIDE SEMICONDUCTOR USED THEREIN AND METHOD FOR MANUFACTURING TRANSISTOR HAVING NITRIDE SEMICONDUCTOR USED THEREIN

(71) Applicants: Yutaro Yamaguchi, Tokyo (JP); Toshiyuki Oishi, Tokyo (JP); Hiroshi Otsuka, Tokyo (JP); Koji Yamanaka, Tokyo (JP)

(72) Inventors: Yutaro Yamaguchi, Tokyo (JP); Toshiyuki Oishi, Tokyo (JP); Hiroshi Otsuka, Tokyo (JP); Koji Yamanaka, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/427,960

(22) PCT Filed: Dec. 17, 2012

(86) PCT No.: PCT/JP2012/082660
§ 371 (c)(1),
(2) Date: Mar. 16, 2015

(87) PCT Pub. No.: WO2014/097369
PCT Pub. Date: Jun. 26, 2014

(65) Prior Publication Data
US 2015/0249150 A1 Sep. 3, 2015

(51) Int. Cl.
*H01L 21/00* (2006.01)
*H01L 29/778* (2006.01)
(Continued)

(52) U.S. Cl.
CPC ....... *H01L 29/7787* (2013.01); *H01L 29/1029* (2013.01); *H01L 29/201* (2013.01);
(Continued)

(58) Field of Classification Search
CPC ............... H01L 29/7787; H01L 29/205; H01L 29/66462; H01L 29/7788; H01L 29/778; H01L 29/7782; H01L 2924/13064
See application file for complete search history.

(56) References Cited

U.S. PATENT DOCUMENTS

| 6,177,685 B1 | 1/2001 | Teraguchi et al. |
| 2003/0102482 A1* | 6/2003 | Saxler ................. H01L 29/7783 257/85 |

(Continued)

FOREIGN PATENT DOCUMENTS

| JP | H11-204778 A | 7/1999 |
| JP | 3372470 B2 | 2/2003 |

(Continued)

OTHER PUBLICATIONS

International Search Report; PCT/JP2012/082660; Jan. 29, 2013.
(Continued)

*Primary Examiner* — Su C Kim
(74) *Attorney, Agent, or Firm* — Studebaker & Brackett PC

(57) ABSTRACT

A portion of an AlN spacer layer of a high electron mobility transistor (GaN HEMI) having a nitride semiconductor used therein is removed only in a region directly below a gate electrode and in a vicinity of the region, and a length of a portion where the AlN spacer layer is not present is sufficiently smaller than a distance between a source electrode and a drain electrode.

1 Claim, 5 Drawing Sheets

(51) Int. Cl.
*H01L 29/66* (2006.01)
*H01L 29/10* (2006.01)
*H01L 29/201* (2006.01)
*H01L 29/205* (2006.01)
*H01L 29/423* (2006.01)
*H01L 29/20* (2006.01)

(52) U.S. Cl.
CPC ...... *H01L 29/205* (2013.01); *H01L 29/42376* (2013.01); *H01L 29/66462* (2013.01); *H01L 29/7786* (2013.01); *H01L 29/2003* (2013.01); *H01L 29/42316* (2013.01); *H01L 29/778* (2013.01); *H01L 29/7782* (2013.01); *H01L 29/7788* (2013.01); *H01L 2924/13064* (2013.01)

(56) References Cited

U.S. PATENT DOCUMENTS

| | | | |
|---|---|---|---|
| 2005/0023555 A1* | 2/2005 | Yoshida | H01L 29/66462 257/192 |
| 2008/0303064 A1 | 12/2008 | Sato | |
| 2010/0314663 A1 | 12/2010 | Ito et al. | |
| 2010/0327322 A1* | 12/2010 | Kub | H01L 29/0847 257/194 |

FOREIGN PATENT DOCUMENTS

| | | |
|---|---|---|
| JP | 2006-286698 A | 10/2006 |
| JP | 2008-306130 A | 12/2008 |
| JP | 2009-054807 A | 3/2009 |
| JP | 2009-099691 A | 5/2009 |
| JP | 2009-152349 A | 7/2009 |

OTHER PUBLICATIONS

B.Padmanabhan et al.; "Modeling Reliability of GaN/AlGaN/AlN/GaN HEMT"; ISDRS 2011; Dec. 7-9, 2011; pp. 1-2; College Park, MD, USA.

The extended European search report issued by the European Patent Office on Sep. 28, 2016, which corresponds to European Patent Application No. 12890237.6-1552 and is related to U.S. Appl. No. 14/427,960.

* cited by examiner (a)

(b)

(c)

(d)

(e)

TRANSISTOR HAVING NITRIDE SEMICONDUCTOR USED THEREIN AND METHOD FOR MANUFACTURING TRANSISTOR HAVING NITRIDE SEMICONDUCTOR USED THEREIN

TECHNICAL FIELD

The present invention relates to a high electron mobility transistor (HEMT) having a nitride semiconductor represented by GaN (gallium nitride), and a method for manufacturing this transistor.

BACKGROUND ART

The structure of a GaN HEMT having an AlN (aluminum nitride) spacer will be described, taking an example of Non-Patent Document 1. In FIG. 1 of Non-Patent Document 1, a sectional view of the structure of the GaN HEMT having the AlN spacer is published. In this conventional structure, an AlN spacer layer (AlN) is crystal-grown on the whole surface of a channel layer (GaN buffer), a barrier layer (AlGaN) is crystal-grown on the AlN spacer layer, and a nitride film (Si3N4), and electrodes (a source electrode (Source), a gate electrode (Gate), and a drain electrode (Drain)) are formed on the barrier layer. The feature of this conventional structure is that the AlN spacer is simply crystal-grown on the whole surface.

The GaN HEMT is used in a high-output and high-frequency amplifier or a power switch circuit.

In order to improve the efficiency of an amplifier or a switch circuit, it is necessary to reduce access resistance that is present in series between a source electrode and a drain electrode. As a method for reducing this access resistance, a method for inserting an AlN spacer between AlGaN (aluminum gallium nitride) and GaN is employed. The polarization of AlN is larger than that of AlGaN, and therefore two-dimensional electron gas concentration is increased by inserting the AlN spacer, whereby the access resistance can be reduced.

FIG. 1 is a schematic sectional view showing an example of a structure of a conventional high electron mobility transistor having a nitride semiconductor used therein (GaN HEMT). As shown in FIG. 1, this conventional GaN HEMT is configured by inserting an AlN spacer, and includes a substrate 1, a buffer layer 2, a channel layer 3, a spacer layer 4, a barrier layer 5, an insulating film layer 6, a source electrode 7, a drain electrode 8, and a gate electrode 9. In this conventional structure, the AlN spacer layer 4 is present on the whole surface including the vicinity directly below the gate electrode 9.

CITATION LIST

Non-Patent Document

Non-Patent Document 1: Balaji Padmanabhan, Dragica Vasileska and Stephen. M Goodnick, "Modeling Reliability of GaN/AlGaN/AlN/GaN HEMT", ISDRS 2011, Dec. 7-9, 2011

SUMMARY OF THE INVENTION

Problems to be Solved by the Invention

However, for example, in the transistor having the conventional structure shown in FIG. 1 or Non-Patent Document 1, there is a problem that reliability is deteriorated while access resistance is reduced by inserting the AlN spacer on the whole surface, and efficiency is improved.

The present invention has been made in order to solve the above problem, and an object of the invention is to provide a transistor having a nitride semiconductor used therein that has high reliability while suppressing increase in access resistance, and a method for manufacturing a transistor having a nitride semiconductor used therein.

Means for Solving the Problems

In order to achieve the above object, according to the present invention, a transistor having a nitride semiconductor used therein includes: a channel layer through which electrons run; a barrier layer that is provided above the channel layer and contains at least one of indium, aluminum and gallium, and nitrogen; and a gate electrode, a source electrode, and a drain electrode that are arranged on the barrier layer, and further includes a spacer layer that is inserted between the barrier layer and the channel layer, and that is larger in polarization than the barrier layer, wherein the spacer layer is not present only in a region directly below the gate electrode.

Effect of the Invention

According to the present invention, the AlN spacer layer is not present in a region directly below the gate electrode, and therefore an electric field on a gate electrode end is reduced as compared to a transistor having a conventional structure, a gate leakage current is reduced, and reliability is ensured. Additionally, a length of a portion where the AlN spacer layer is not present is sufficiently smaller than a distance between the source electrode and the drain electrode, and therefore reduction in access resistance by the AlN spacer layer can be kept to the same degree as the conventional structure, and increase in the access resistance can be suppressed.

MODES FOR CARRYING OUT THE INVENTION

Hereinafter, embodiments of the present invention will be described with reference to the figures.
Embodiment 1

Figure 1:
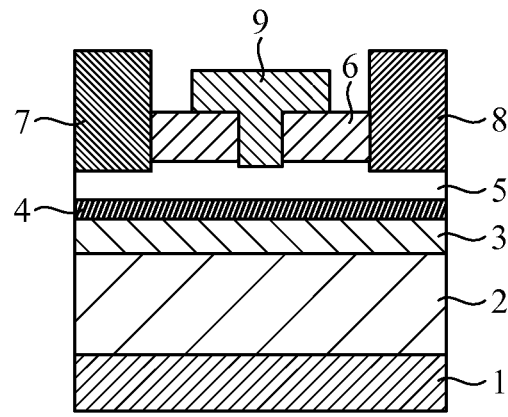
FIG. 1 is a schematic sectional view showing an example of a structure of a conventional high electron mobility transistor having a nitride semiconductor used therein (GaN HEMT).
Figure 2:
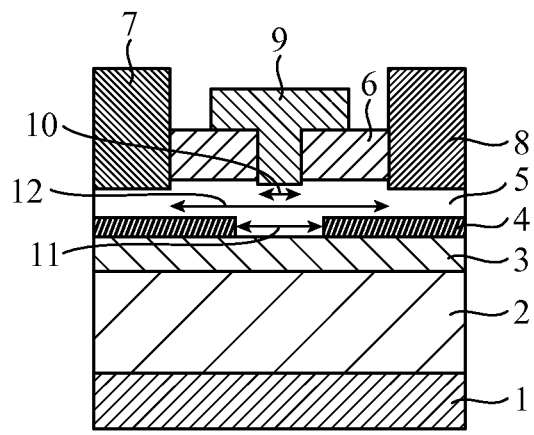
FIG. 2 is a schematic sectional view showing an example of a structure of a high electron mobility transistor having a nitride semiconductor used therein (GaN HEMT) according to Embodiment 1.

FIG. 2 is a schematic sectional view showing an example of a structure of a high electron mobility transistor having a nitride semiconductor used therein (GaN HEMI) according to Embodiment 1 of the present invention. Configurations similar to those described in a conventional view (FIG. 1) are followed by the same reference numerals, and redundant description will be omitted. Embodiment 1 described below is different from the conventional view (FIG. 1) in that there is a portion where an AlN spacer layer 4 is not present.

In FIG. 2, Lg10 denotes a horizontal length of a gate electrode 9, and W11 denotes a horizontal length of the portion where the spacer layer 4 is not present. Additionally, Lsd12 denotes a horizontal length between a source electrode 7 and a drain electrode 8. An element isolation region, wirings and the like are actually present, but these are not related to operation of the present invention, and therefore illustration and description thereof will be omitted.

Incidentally, although the GaN HEMI of Embodiment 1 is utilized as a single amplifier, the present invention is also applicable to a transistor that configures a MMIC (monolithic microwave integrated circuit).

As a substrate 1, a sapphire, SiC (silicon carbide), Si (silicon), or GaN substrate, or the like is used. Particularly, while a semi-insulating SiC substrate having excellent thermal conductivity is generally utilized, a conventional Si substrate is also often utilized as a semiconductor substrate since the cost is low.

A buffer layer 2 is a layer inserted between the substrate 1 and a channel layer 3, and various structures of AlN, AlGaN, GaN/InGaN, AlN/AlGaN, and a superlattice thereof are used in order to improve the crystalline of the channel layer 3, and to confine electrons in the channel.

The channel layer 3 is a layer through which electrons (current) necessary for transistor operation run. As the typical channel layer 3, GaN is used, InGaN (indium gallium nitride), AlGaN, or a multilayer structure thereof can be also used.

The spacer layer 4 is inserted between the channel layer 3 and a barrier layer 5. The spacer layer 4 is present on the whole surface including the source electrode 7 and the drain electrode 8 (the whole surface including also the region directly below the gate electrode 9) in the conventional structure (FIG. 1), but in the structure of Embodiment 1 the AlN spacer layer 4 is not present only in a region directly below the gate electrode 9. It is to be noted that the region directly below in this invention includes the vicinity directly below. Also, the lateral position of the midpoint of Lg10 coincides with the lateral position of the midpoint of W11. This spacer layer 4 is not limited to AlN, and any layer that is larger in polarization than the barrier layer 5 such as InGaN and AlGaN may be employed.

The barrier layer 5 forms a two-dimensional electron gas in the channel layer 3, and therefore is provided above the channel layer 3, and is a layer containing at least one of In (indium), Al (aluminum) and Ga (gallium), and N (nitrogen). As this barrier layer 5, an AlGaN single layer is often used. In addition to this, an advantageous effect of the present invention is obtained when the barrier layer 5 is constituted by a combination of a plurality of AlGaN matters having different compositions, thicknesses, and impurity concentrations, or a combination of AlGaN and GaN or AlN.

An interface in contact with the channel layer 3 and the AlN spacer layer 4 is formed by a heterojunction having a wider band gap than the channel layer 3. Any structure from the substrate 1 to the channel layer 3 is applicable to the present invention.

The insulating film layer 6 on the barrier layer 5 serves as a film for suppressing the number of traps on the surface of the barrier layer 5. A portion where the insulating film layer 6 is present may be an insulating film containing, as a material, Si that serves as a donor, such as SiN (silicon nitride) and SiO (silicon oxide). When Si is contained, it serves as a donor and supplies electrons to the barrier layer 5, and the number of traps on the surface of the barrier layer 5 can be reduced.

The source electrode 7 and the drain electrode 8 each are an electrode that extracts a current (electrons) in the channel layer 3 to the outside of the HEMT. Therefore, the source electrode 7 and the drain electrode 8 are formed such that resistance between the electrodes and the two-dimensional electron gas is reduced as much as possible. The source electrode 7 and the drain electrode 8 are formed so as to be in contact with the barrier layer 5 in FIG. 2, but may be formed so as to be directly in contact with the two-dimensional electron gas (2DEG). Additionally, an $n^+$ region may be formed below the source electrode 7 and the drain electrode 8.

The gate electrode 9 is formed so as to contain metal that is in Schottky contact with the barrier layer 5, and 2DEG concentration below the gate electrode 9 is controlled, thereby implementing a transistor operation. The gate electrode 9 has a gate field plate structure (GFP structure) such that its part protrudes onto the insulating film layer 6. The GFP structure serves as the relaxation of electric field concentration on the surface of the barrier layer 5.

How a gate leakage current is reduced and reliability is ensured as compared to the conventional structure, and how an effect of reducing access resistance is kept to the same degree as the conventional structure in the structure of the transistor according to Embodiment 1 are explained below.

As shown in FIG. 1, in the conventional structure, an AlN spacer layer 4 is provided over the whole surface between a source electrode 7 and a drain electrode 8. The AlN spacer layer 4 is larger in polarization than a barrier layer 5, and therefore two-dimensional electron gas concentration in a channel layer 3 can be greater due to the insertion of the AlN spacer layer 4, in comparison with a case where only the barrier layer 5 is present.

Therefore, it is possible to reduce access resistance that is present between the source electrode 7 and the drain electrode 8. On the other hand, when the polarization is increased, an electric field that is concentrated on a gate electrode end is particularly increased. Increase in the electric field in the gate electrode end increases a tunnel current through which electrons runs from a gate electrode 9 toward the barrier layer 5, and therefore a reverse gate leakage current during OFF-operation increases. The increase in the reverse gate leakage current can be a factor for deteriorating the reliability of the GaN HEMT.

In the structure of the transistor according to Embodiment 1 of the present invention, as shown in FIG. 2, an electric field in the gate electrode end is reduced by deleting the AlN spacer layer 4 in the region directly below the gate electrode 9, which causes the increase in the electric field at the gate electrode end, whereby it is possible to reduce a reverse gate leakage current. Additionally, the length W11 of a portion in which the AlN spacer layer 4 is deleted is sufficiently smaller than the Lsd12 between the source electrode 7 and the drain electrode 8, and therefore even when the AlN spacer layer 4 is deleted, it is considered that the effect of reducing the access resistance is maintained at a level substantially identical to that of the conventional structure.

The aforementioned principle is validated by device simulation. In the GaN HEMT having the conventional structure shown in FIG. 1, and the GaN HEMT having the structure of the Embodiment 1 of the present invention shown in FIG. 2, electric fields of portions located below the surface of the barrier layer 5 by 0.5 nm at a gate voltage of −5 V and at a drain voltage of 30 V were calculated. The channel layer 3 was formed of GaN, the spacer layer 4 was formed of AlN, the barrier layer 5 was formed of AlGaN (Al composition: 0.23). Additionally, the thickness of the channel layer 3 was set to 1.2 μm, the spacer layer 4 was set to 1 nm, and the thickness of the barrier layer 5 was set to 20 nm.

In addition, the ratio of the length W11 of the portion in which the AlN spacer layer 4 is deleted to the gate length Lg10 (W/Lg) in the structure of Embodiment 1 of the present invention was set to "2". The polarization of a portion in which the AlN spacer layer 4 is present was set to an average value of the polarization of the AlGaN barrier layer 5 and the polarization of the AlN spacer layer 4, which was 5.27E-12 $cm^{-3}$, and the polarization of the portion in which the AlN spacer layer 4 is not present is set to the polarization of the AlGaN barrier layer 5, namely 8.85E-12 $cm^{-3}$.

Figure 3:
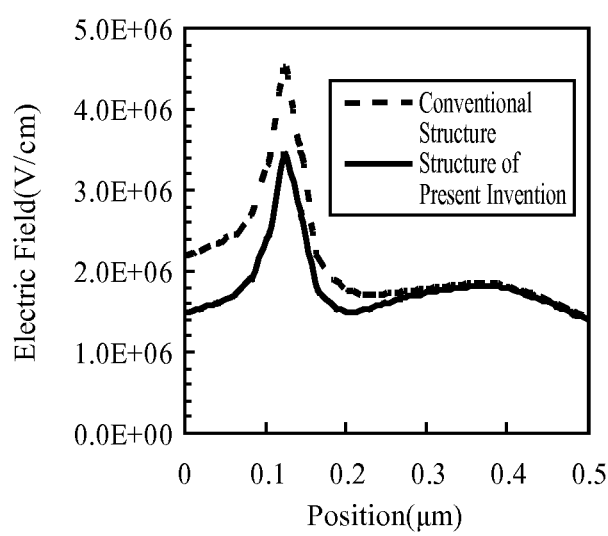
FIG. 3 is a block diagram showing an example of a configuration of a voice processor according to Embodiment 1.

FIG. 3 is a diagram showing electric fields in gate electrode ends located below the surface of the barrier layer 5 by 0.5 nm, with respect to the lateral distances (positions from the center of the horizontal direction). As shown in FIG. 3, in the structure of Embodiment 1, it is found that an electric field in the vicinity of the gate electrode can be reduced as compared with the conventional structure.

Figure 4:
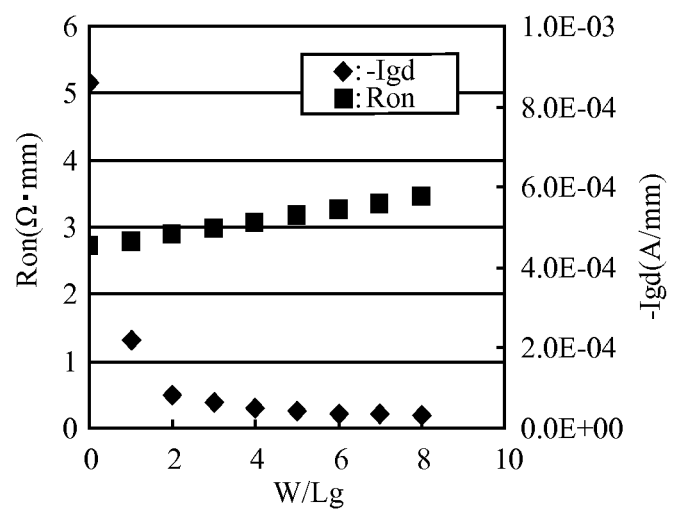
FIG. 4 is a figure showing W/Lg dependency of access resistance Ron and reverse gate current −Igd of each of the conventional structure and the structure according to Embodiment 1.

FIG. 4 is a figure showing W/Lg dependency of access resistance Ron and reverse gate leakage current −Igd of each of the conventional structure and the structure according to Embodiment 1. Since W=0 is established in the conventional structure, a value in a case of horizontal axis W/Lg=0 in FIG. 4 shows access resistance Ron in the conventional structure and a reverse gate leakage current −Igd in a case of −Vgd=100 V.

Then, in the structure according to the Embodiment 1 of the present invention, as shown in FIG. 4, it is found that the reverse current −Igd is significantly reduced until W/Lg reaches 2, but the reverse current −Igd is gradually saturated when W/Lg becomes larger than 2 (when W doubles Lg).

Further, the access resistance Ron increases, when W/Lg increases. This is because, when W/Lg increases, the length of the portion in which the AlN spacer layer 4 is present to Lsd12 is reduced, and therefore a two-dimensional electron gas increase effect by the AlN spacer is lowered. When W/Lg is 2, that is, when the horizontal length W11 of the portion in which the spacer layer 4 is not present is twice the horizontal length Lg10 of the gate electrode 9, the portion in which the AlN spacer layer 4 is deleted is the region directly below the gate electrode 9, and therefore it can be said that the reverse gate leakage current −Igd can be significantly reduced while the increase of the access resistance Ron is suppressed.

Thus far, the structure and its operation in Embodiment 1 of the present invention are described, and its effectiveness is validated by calculation. Next, a method for manufacturing the GaN HEMT in Embodiment 1 will be specifically described with reference to FIG. 5 and FIG. 6.

Figure 5:
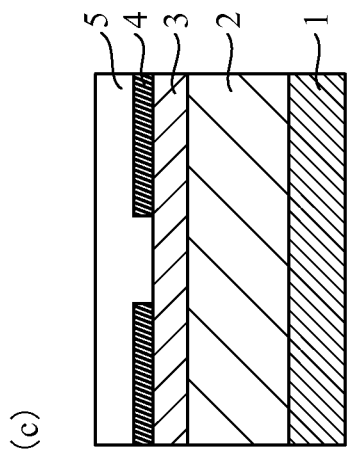
FIG. 5 is a set of figures showing a manufacturing method implemented up to the formation of a buffer layer, a channel layer, a spacer layer, a barrier layer, an insulating film layer, a source electrode, and a drain electrode on a substrate.
Figure 5:
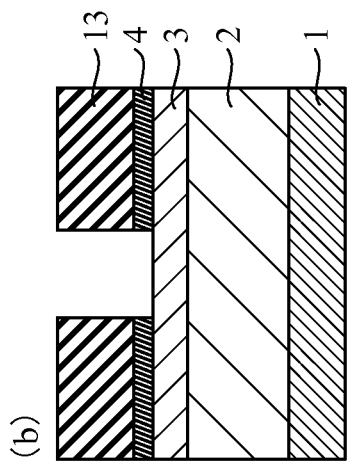
Figure 5:
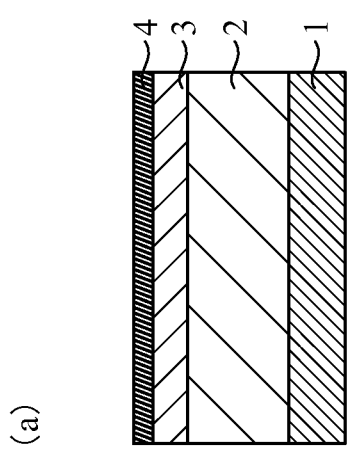
Figure 5:
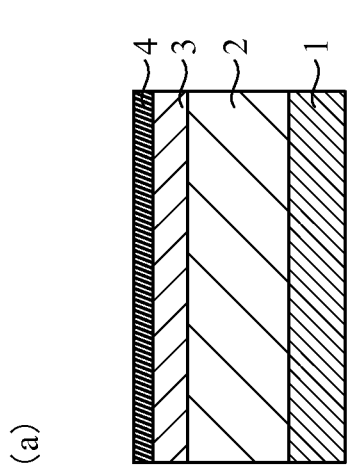
Figure 5:
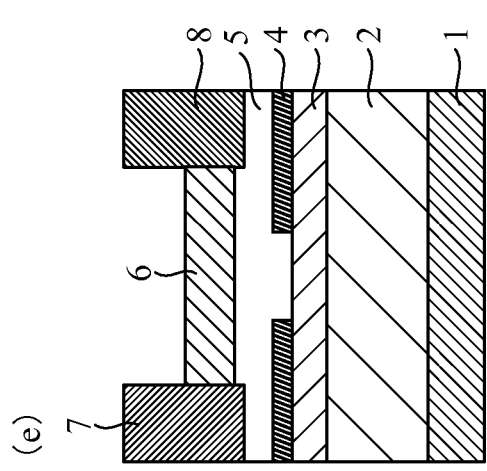
Figure 6:
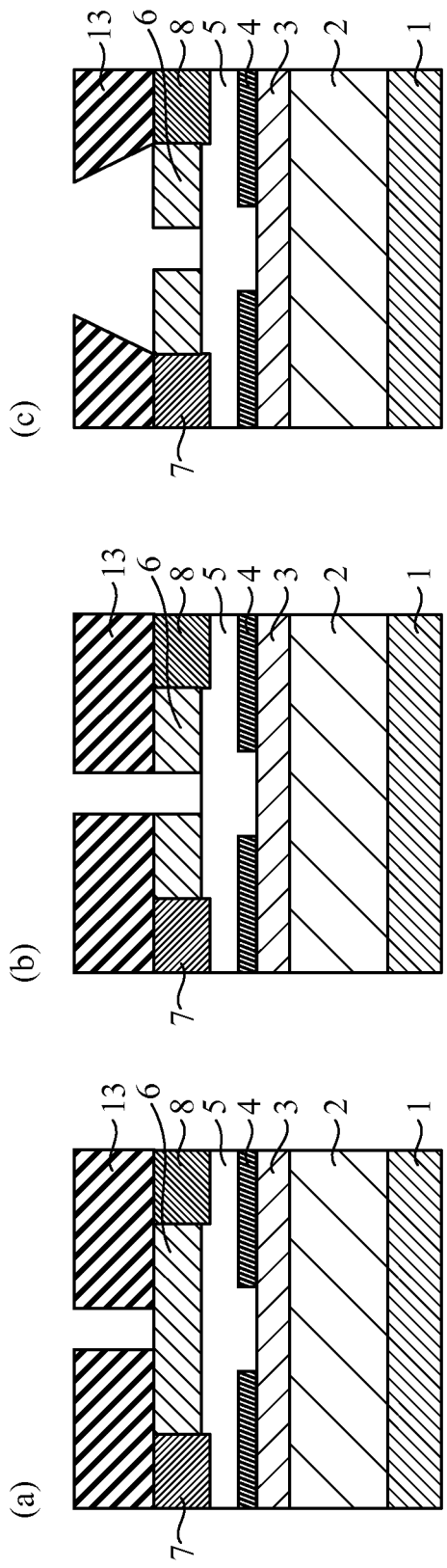
FIG. 6 is a set of figures showing a manufacturing method for forming a gate electrode after the manufacturing method shown in FIG. 5, in Embodiment 1.

FIG. 5 shows a set of figures showing a manufacturing method up to the formation of the buffer layer 2, the channel layer 3, the spacer layer 4, the barrier layer 5, the insulating film layer 6, the source electrode 7, and the drain electrode 8 on the substrate 1. In addition, FIG. 6 is a set of figures showing a subsequent manufacturing method for forming the gate electrode 9.

As shown in FIG. 5(a), the buffer layer 2, the channel layer 3, and the spacer layer 4 are first formed on the substrate 1. For these, a MOCVD (metal organic chemical vapor deposition), and/or a MBE (molecular beam epitaxy) can be used. The spacer layer 4 is not limited to AlN, and any material that is larger in polarization than the barrier layer 5 may be employed. Such a manufacturing method up to the formation of the spacer layer 4 on the channel layer 3 is the same as that of the conventional one.

Next, as shown in FIG. 5(b), a pattern having an opening in a region in which the AlN spacer layer 4 located directly below the gate electrode 9 is removed by photoengraving (photolithography) is formed with a resist 13. That is, the resist 13 is patterned on the spacer layer 4 except the portion in which the spacer layer 4 is to be removed.

Then, while the patterned resist 13 is used as a mask, the AlN spacer layer 4 in the region to be directly below the gate electrode 9 is removed by etching, and thereafter, the patterned resist 13 is removed.

Next, as shown in FIG. 5(c), the barrier layer 5 is regrown and formed on top of the channel layer 3 and the AlN spacer layer 4. As this method, the MOCVD can be used.

Further, as shown in FIG. 5(d), the insulating film layer 6 is formed on the barrier layer 5. Although the material of the insulating film layer 6 is typically SiN and SiO, any other materials may be employed as long as the insulating film layer 6 is an insulating film containing Si.

Then, as shown in FIG. 5(e), in order to form the source electrode 7 and the drain electrode 8, the insulating film layer 6 at portions corresponding to the positions at which the source electrode 7 or the drain electrode 8 are formed through a mask such as resist or SiO is removed. Thereafter, metal formation of Ti/Al/Ni/Au, Ti/Al, or the like is performed, and a heat treatment is preformed, whereby the source electrode 7 and the drain electrode 8 can be formed. In this process, a heat treatment can also be added thereto by implanting a dopant such as Si ion thereto.

Next, as shown in FIG. 6(a), a pattern having an opening in a region to form the gate electrode by photoengraving is formed with a resist 13. That is, the resist 13 is patterned again (re-patterned) on the insulating film layer 6, the source electrode 7, and the drain electrode 8 except a portion in which the gate electrode 9 is formed.

Then, as shown in FIG. 6(b), after the insulating film layer 6 in the region to form the gate electrode 9 is removed by etching using the re-patterned resist 13 as a mask, the re-patterned resist 13 is removed.

Next, as shown in FIG. 6(c), a pattern having a larger opening than the region etched in FIG. 6(b) is formed with a resist 13 such that gate electrode 9 is formed also on the insulating film layer 6 by photoengraving. That is, the resist 13 having the larger opening than the region in which the insulating film layer 6 is removed by etching is finally patterned.

Thereafter, the gate electrode 9 is formed on the region in which the insulating film layer 6 is removed by etching, and the insulating film layer 6, and the finally patterned resist is removed. Specifically, metal having Schottky characteristics is deposited (EB (electron beam) vapor deposition or sputtering can be used), the resist 13 is removed (lifted off), whereby it is possible to form the structure as shown in FIG. 2. Finally, a protective film, wiring, via hole wiring, capacity, resistance, or the like is produced as needed, but illustration and description thereof will be omitted here.

As described above, according to Embodiment 1, the AlN spacer layer is not present in the region directly below the gate electrode, and therefore the electric field at the gate electrode end is smaller than that of the transistor having the conventional structure, and the gate leakage current is reduced and reliability is secured. Additionally, the length of the portion in which the AlN spacer layer is not present is sufficiently smaller than the distance between the source electrode and the drain electrode, and therefore reduction in access resistance by the AlN spacer layer can be kept to the same degree as the conventional structure, and increase in access resistance can be suppressed.

Embodiment 2

Figure 7:
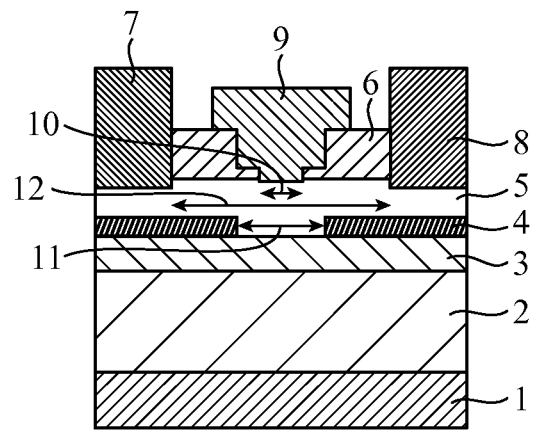
FIG. 7 is a schematic sectional view showing an example of a structure of a high electron mobility transistor having a nitride semiconductor used therein (GaN HEMT) according to Embodiment 2.

FIG. 7 is a schematic sectional view showing an example of a structure of a high electron mobility transistor having a nitride semiconductor used therein (GaN HEMI) according to Embodiment 2 of the present invention. Note that components similar to those described in the conventional view (FIG. 1) and Embodiment 1 are denoted by the same reference numerals, and redundant description thereof will be omitted. A structure of a gate electrode 9 of Embodiment 2 described below is different from that of Embodiment 1 in that the gate electrode 9 on the insulating film layer 6 has a two-tiered structure.

In this way, the gate electrode 9 is configured to be two-tiered, whereby the number of edges increases, and therefore an advantageous effect of dispersing an electric field that is concentrated at a gate electrode end is enhanced. Therefore, a larger electric field reduction than the case of Embodiment 1 becomes possible, a reverse gate leakage current is reduced, and furthermore, reliability is improved.

Also in the GaN HEMT of Embodiment 2, a manufacturing method up to the formation of a buffer layer 2, a channel layer 3, a spacer layer 4, a barrier layer 5, the insulating film layer 6, a source electrode 7, and a drain electrode 8 on a substrate 1 is the same as the method described in Embodiment 1 with reference to FIG. 6.

Next, as shown in FIG. 6(a), the formation of a pattern having an opening on a region that becomes the gate electrode by photoengraving, with a resist 13 is the same as that of Embodiment 1.

In this connection, in a case where the structure shown in FIG. 7 is formed, two kinds of insulating films whose etching rates of wet etching are different need to be formed when the insulating film layer 6 is formed. An insulating film whose etching rate is low of the two kinds of insulating film is disposed in a lower layer, and an insulating film whose etching rate is high is disposed in an upper layer, thereby forming a double-layer structure. As such a method for forming the double-layer structure, there are various methods such as cat-CVD (catalytic chemical vapor deposition), plasma CVD, and sputtering.

In this way, in order to form the insulating film layer 6 so as to have the double-layer structure in which the etching rates are different, as shown in FIG. 6 (b), after the insulating film layer 6 in a region to form the gate electrode is etched, only the upper layer is wet-etched before the resist 13 is removed. The etching rate of the upper layer of the two layers of the insulating film layer 6 is high, and therefore etching portions of the side surfaces can be configured to be two-tiered, and the insulating film layer 6 having the double-layer structure in Embodiment 2 can be formed.

Thereafter, after the resist 13 is removed, a pattern having a larger opening than the region etched in FIG. 6 (b) is formed with a resist 13 such that the gate electrode 9 is formed also on the insulating film layer 6 by photoengraving, as shown in FIG. 6(c).

Then, metal having Schottky characteristics is deposited (EB (electron beam) vapor deposition or sputtering can be used), the resist 13 is removed (lifted off), whereby it is possible to form the structure as shown in FIG. 7. Finally, a protective film, wiring, via hole wiring, capacity, resistance, or the like is produced as needed, but illustration and description thereof will be omitted.

As described above, according to Embodiment 2, the gate electrode has the two-tiered structure, whereby the number of edges increases, and the advantageous effect of dispersing the electric field that is concentrated at the gate electrode end is enhanced. Therefore, larger electric field reduction as compared to the transistor of Embodiment 1 becomes possible, a reverse gate leakage current is reduced, and furthermore, reliability is improved.

Embodiment 3

Figure 8:
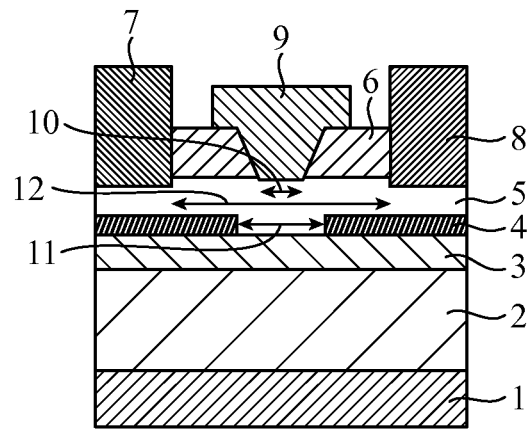
FIG. 8 is a schematic sectional view showing an example of a structure of a high electron mobility transistor having a nitride semiconductor used therein (GaN HEMI) according to Embodiment 3.

FIG. 8 is a schematic sectional view showing an example of a structure of a high electron mobility transistor having a nitride semiconductor used therein (GaN HEMI) according to Embodiment 3 of the present invention. Note that components similar to those described in the conventional view (FIG. 1) and Embodiments 1 and 2 are denoted by the same reference numerals, and redundant description thereof will be omitted. A structure of a gate electrode 9 of Embodiment 3 described below is different from that of Embodiment 1 in that the gate electrode 9 on an insulating film layer 6 has an inclined structure.

In this way, the gate electrode 9 is inclined, whereby an electric field is averaged, and therefore it is possible to reduce an electric field that is concentrated at a gate electrode end. Therefore, electric field reduction can be implemented at a greater level than that of the case of Embodiment 1, a reverse gate leakage current is reduced, and furthermore, reliability is improved.

Also in the GaN HEMI of Embodiment 3, a manufacturing method up to the formation of a buffer layer 2, a channel layer 3, a spacer layer 4, a barrier layer 5, the insulating film layer 6, a source electrode 7, and a drain electrode 8 on a substrate 1 is the same as the method described in Embodiment 1 with reference to FIG. 5.

Figure 9:
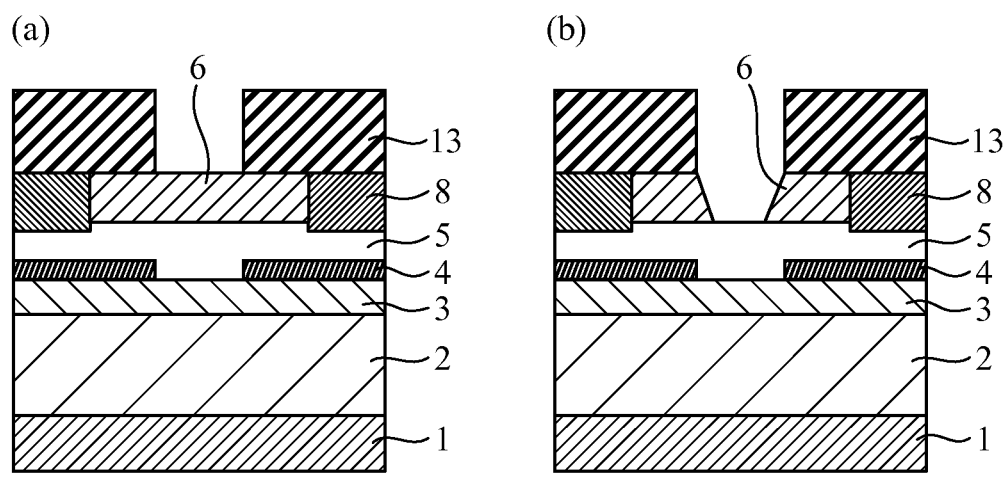
FIG. 9 is a set of figures showing a manufacturing method for forming a gate electrode after the manufacturing method shown in FIG. 5, in Embodiment 3.

FIG. 9 is a set of figures showing a manufacturing method for forming the gate electrode 9 after the manufacturing method shown in FIG. 5, in Embodiment 3.

As shown in FIG. 9 (a), a pattern having an opening on a region to form the gate electrode by photoengraving is formed with a resist 13.

Then, as shown in FIG. 9 (b), after side surfaces of an etching portion are inclined depending on an etching condition at this time, and the insulating film layer 6 in the region that becomes the gate electrode is removed by etching, the resist 13 is removed.

Thereafter, as shown in FIG. 6 (c), a pattern having a larger opening than the region etched in FIG. 9 (b) is formed with a resist 13 such that the gate electrode 9 is formed also on the insulating film layer 6 by photoengraving.

Then, metal having Schottky characteristics is deposited (EB (electron beam) vapor deposition or sputtering can be used), the resist 13 is removed (lifted off), whereby it is possible to form the structure as shown in FIG. 8. Finally, a protective film, wiring, via hole wiring, capacity, resistance, or the like is produced as needed, but illustration and description thereof will be omitted.

As described above, according to Embodiment 3, the side surfaces of the gate electrode are inclined, whereby an electric field is averaged, and it is possible to reduce the electric field that is concentrated at the gate electrode end. Therefore, larger electric field reduction as compared to the transistor of Embodiment 1 is possible, a reverse gate leakage current is reduced, and furthermore, reliability is improved.

Incidentally, the present invention can be implemented by free combination of the respective embodiments, modification of arbitrary components of the respective embodiments, or omission of arbitrary components of the respective embodiments, within the scope of the invention.

INDUSTRIAL APPLICABILITY

A transistor having a nitride semiconductor used therein of the present invention, and a method for manufacturing a transistor having a nitride semiconductor used therein are applicable to an amplifier or a power switch circuit.

DESCRIPTION OF REFERENCE NUMERALS AND SIGNS

1: SUBSTRATE
2: BUFFER LAYER
3: CHANNEL LAYER
4: SPACER LAYER
5: BARRIER LAYER
6: INSULATING FILM LAYER
7: SOURCE ELECTRODE
8: DRAIN ELECTRODE
9: GATE ELECTRODE
10: LENGTH OF GATE ELECTRODE 9 (Lg)
11: LENGTH OF PORTION WHERE SPACER LAYER 4 IS NOT PRESENT (W)
12: LENGTH BETWEEN SOURCE ELECTRODE 7 AND DRAIN ELECTRODE 8 (Lsd)
13: RESIST.

The invention claimed is:

1. A method for manufacturing a transistor having a nitride semiconductor used therein, the transistor including: a channel layer through which electrons run; a barrier layer that is provided above the channel layer and contains at least one of indium, aluminum and gallium, and nitrogen; and a gate electrode, a source electrode, and a drain electrode that are arranged on the barrier layer, the method comprising:

a step of forming a spacer layer that is larger in polarization than the barrier layer, on the channel layer;

a step of patterning a resist on the spacer layer except a portion where the spacer layer is removed;

a step of removing by etching the spacer layer located in a region to be directly below the gate electrode using the patterned resist as a mask;

a step of removing the patterned resist;

a step of forming the barrier layer on top of the channel layer and the spacer layer;

a step of forming an insulating film layer on the barrier layer;

a step of removing the insulating film layer corresponding to positions to be formed by the source electrode and the drain electrode, and then forming the source electrode and the drain electrode;

a step of re-patterning a resist on the insulating film layer, the source electrode, and the drain electrode except a portion where the gate electrode is formed;

a step of removing by etching the insulating film layer in a region to form the gate electrode using the re-patterned resist as a mask;

a step of removing the re-patterned resist;

a step of finally patterning a resist having a larger opening than a region where the insulating film layer is removed by etching;

a step of forming the gate electrode on the region where the insulating film layer is removed by etching, and on the insulating film layer; and a step of removing the finally patterned resist.

* * * * *